United States Patent
Bhavikatti

(10) Patent No.: US 9,741,445 B1
(45) Date of Patent: Aug. 22, 2017

(54) CUT LAYER PROGRAMMABLE MEMORY

(71) Applicant: ARM Limited, Cambridge (GB)

(72) Inventor: Vasimraja Bhavikatti, San Jose, CA (US)

(73) Assignee: ARM Limited, Cambridge (GB)

( * ) Notice: Subject to any disclaimer, the term of this patent is extended or adjusted under 35 U.S.C. 154(b) by 0 days.

(21) Appl. No.: 15/222,532

(22) Filed: Jul. 28, 2016

(51) Int. Cl.
  *G11C 17/12* (2006.01)
  *H01L 27/06* (2006.01)

(52) U.S. Cl.
  CPC .......... *G11C 17/12* (2013.01); *H01L 27/0688* (2013.01)

(58) Field of Classification Search
  CPC ............................. G11C 17/12; H01L 27/0688
  USPC ........................................................ 365/104
  See application file for complete search history.

(56) References Cited

U.S. PATENT DOCUMENTS

| | | | |
|---|---|---|---|
| 5,768,206 A * | 6/1998 | McClure | G11C 7/12 365/189.11 |
| 2005/0002215 A1* | 1/2005 | Morishima | G11C 11/412 365/120 |
| 2006/0215472 A1* | 9/2006 | Yoon | G11C 11/4097 365/207 |

* cited by examiner

*Primary Examiner* — Hoai V Ho
*Assistant Examiner* — Muna A Techane
(74) *Attorney, Agent, or Firm* — Pramudji Law Group PLLC; Ari Pramudji

(57) ABSTRACT

Various implementations described herein are directed to an integrated circuit. The integrated circuit may include a bitline. The integrated circuit may include a memory cell array having a plurality of memory cells. The integrated circuit may include a plurality of via paths coupling each of the memory cells to the bitline. The integrated circuit may include one or more open paths formed to decouple one or more memory cells from their corresponding via path to the bitline.

19 Claims, 4 Drawing Sheets

CUT LAYER PROGRAMMABLE MEMORY

BACKGROUND

This section is intended to provide information relevant to understanding various technologies described herein. As the section's title implies, this is a discussion of related art that should in no way imply that it is prior art. Generally, related art may or may not be considered prior art. It should therefore be understood that any statement in this section should be read in this light, and not as any admission of prior art.

In the electronics industry, a via is a vertical conductive connection that passes through adjacent layers in an integrated circuit. Typically, a via may be used to electrically connect wiring between physical layers. Some integrated circuits include memory, such as, e.g., Read-Only Memory (ROM), that use transistors to store binary data values, which are programmed during fabrication. Conventional fabrication techniques typically use vias to program ROM. For instance, a via is used to electrically connect a transistor to a bitline to program a logical '1', and a via is left out to electrically disconnect a transistor from the bitline to program a logical '0'. Unfortunately, these conventional fabrication techniques are inefficient and costly due to overusing masks. For instance, when programming ROM, multiple mask changes are used for multi-patterning of vias during fabrication.

FIG. 1 illustrates conventional memory circuitry 100, such as, e.g., Read-Only Memory (ROM), as known in the art. As shown, the circuitry 100 includes memory cells 102 having a transistor connected between a bitline BL and a ground line VSB. Some of the memory cells 102 are programmed with a logical '1' by connecting their transistors to the bitline BL with vias 110, and some of the memory cells 102 are programmed with a logical '0' by not connecting their transistors to the bitline BL with vias.

BRIEF DESCRIPTION OF THE DRAWINGS

Implementations of various techniques are described herein with reference to the accompanying drawings. It should be understood, however, that the accompanying drawings illustrate only various implementations described herein and are not meant to limit embodiments of various techniques described herein.

DETAILED DESCRIPTION

Various implementations described herein refer to and are directed to using a cut metal layer for programming memory. For instance, some implementations may refer to mask programmable ROM using CUT layers, wherein CUT metal programmable ROM may be programmed using CUT layers unlike conventional ROM which use only via layers for programming. As such, ROM may be programmed by decoupling metal lines using CUT layers unlike conventional ROM where programming is only achieved by establishing electrical connection between different metal lines using vias. Various implementations described herein may be focused on reducing mask cost while programming ROM with CUT layers. For instance, in lower nodes (e.g., -7 nm and -10 nm) vias may be double-patterned or triple-patterned, and also these are implicit colored, which refers to coloring decomposition that may happen during fabrication and not during design. In conventional ROM, programming is achieved using a via layer that is double or triple-patterned, which may cost two or three mask changes during fabrication due to double-patterning or triple-patterning. Hence, this multi-patterning increases mask cost. In contrast to conventional fabrication techniques, some implementations of CUT layers as described herein may be dedicated to a single pre-colored metal. Thus, programming ROM with CUT metal layers may provide for changing a single one mask during fabrication, which likely reduces mask cost when programming ROM during fabrication.

Various implementations of cut layer programmable memory will be described in greater detail herein with reference to FIGS. 2A-4.

Figures 2A, 2B:
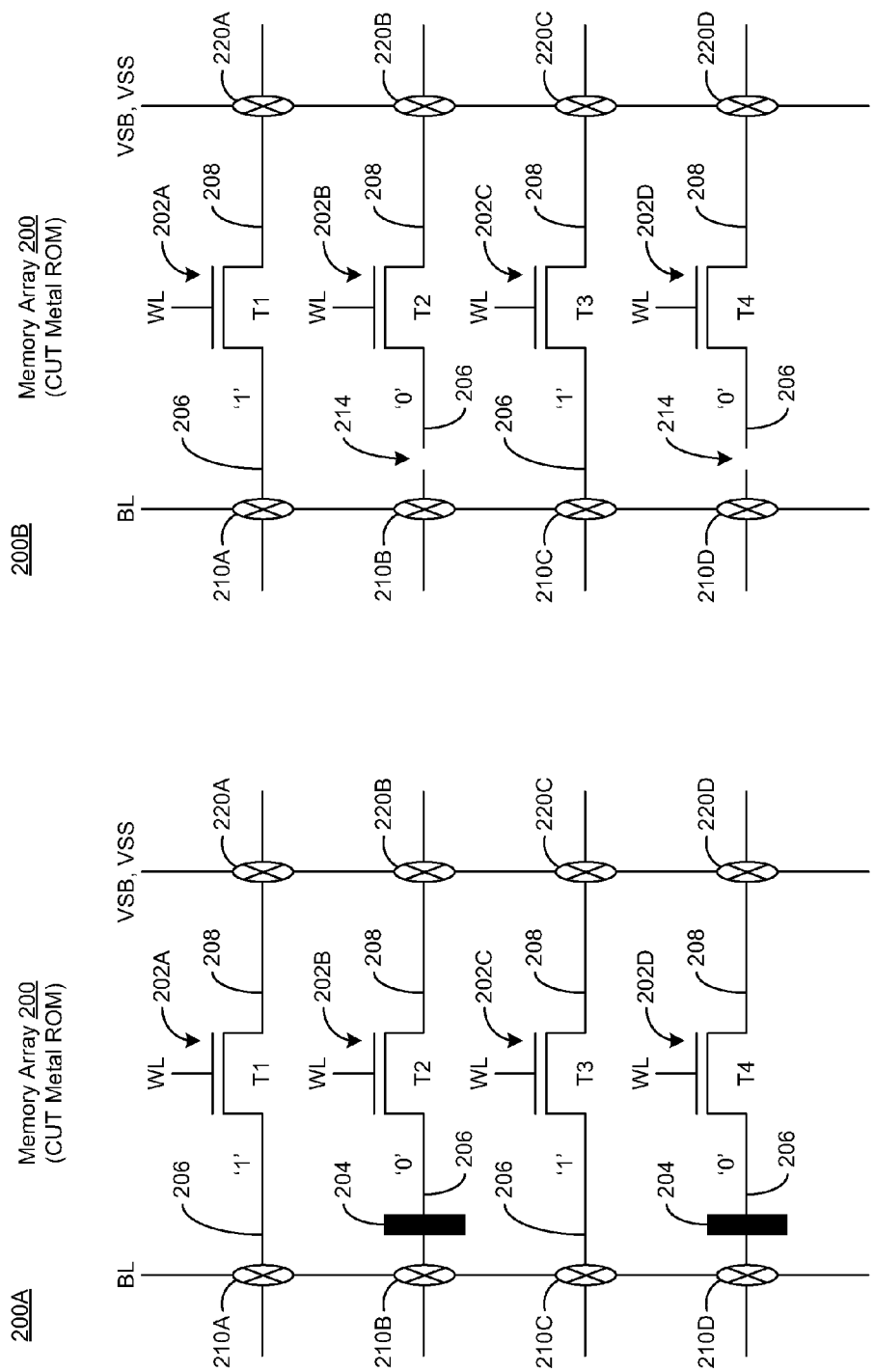
FIGS. 2A-2B illustrate diagrams of a cut metal memory array with a first type of transistor in accordance with various implementations described herein.

FIGS. 2A-2B illustrate diagrams of a cut metal memory array 200 with a first type of memory cell 202 (e.g., implementing a first type of transistor) in accordance with various implementations described herein. In particular, FIG. 2A illustrates a diagram 200A of an array of memory cells 202A, 202B, 202C, 202D having a first open path 204 shown with a black void for a CUT layer, and FIG. 2B illustrates another diagram 200B of the array of memory cells 202A, 202B, 202C, 202D having a second open path 214 shown with a cut opening. These and other features are described herein below.

The memory array 200 may be implemented as a memory circuit, such as, e.g., an integrated circuit (IC) utilizing various types of memory (e.g., ROM, RAM, and/or any other types of memory, including any type of volatile and non-volatile memory). In some implementations, the memory array 200 may be integrated with computing circuitry and various other related components on a single chip. The memory array 200 may be further used in an embedded system for various electronic and mobile applications.

In reference to FIGS. 2A-2B, the memory array 200 may include an access path or wire, such as, e.g., a bitline BL. In the memory array 200, the memory cells 202A, 202B, 202C, 202D may be arranged in a column with multiple rows (as shown), and the bitline 200 may be used to access data stored in each memory cell 202A, 202B, 202C, 202D with assistance of a wordline WL. For instance, by activating a specific memory cell 202A, 202B, 202C, 202D with wordline WL, data stored in the specific memory cell 202A, 202B, 202C, 202D may be accessed by way of the bitline BL.

The memory array 200 may include a voltage source bus VSB. In some cases, each of the memory cells 202A, 202B, 202C, 202D may be coupled to the voltage source bus VSB. For instance, as shown in FIGS. 2A-2B, each of the memory cells 202A, 202B, 202C, 202D may be coupled between the bitline BL and the voltage source bus VSB by way of metal traces 206, 208 that extend between each of the memory cells 202A, 202B, 202C, 202D and the bitline BL and also the voltage source bus VSB.

In some cases, the metal traces 206, 208 (or metal trace wires) may be formed (or disposed) with a first metal layer M1 (e.g., metal 1 layer). Further, in some cases, the bitline BL may be formed with a second metal layer M2 (e.g., metal 2 layer) that is different than the first metal layer M1. Further, in some cases, the memory cells 202A, 202B, 202C, 202D in the memory array 200 may be formed with one or more other layers that are different than the first and second layers M1, M2.

As shown in FIGS. 2A-2B, the memory array 200 may include the plurality of memory cells 202A, 202B, 202C, 202D. In some cases, each memory cell 202A, 202B, 202C, 202D may be referred to as a bitcell, and each memory cell may be configured to store at least one data bit value (e.g., a data value associated with logical '0' or '1'). In various implementations, the memory array 200 may include any number of memory cells arranged in various configurations, such as, e.g., a two-dimensional (2D) memory array having columns and rows of multiple memory cells arranged in a 2D grid pattern with 2D indexing capabilities. Further, in some cases, multiple 2D memory arrays may be stacked to form a three-dimensional array (3D) having 3D indexing capability.

The memory array 200 may include a plurality of via paths 210A, 210B, 210C, 210D coupling each of the memory cells 202A, 202B, 202C, 202D to the bitline BL. In some cases, the one or more via paths 210A, 210B, 210C, 210D may be referred to as one or more vertical interconnect access (VIA) paths. In some cases, the via paths 210A, 210B, 210C, 210D may be formed with one or more other layers that are different than the first and second layers M1, M2 and that are different than the one or more other layers for the memory cells 202A, 202B, 202C, 202D.

As shown in FIG. 2A, the memory array 200 may include one or more open paths 204 formed to decouple (or electrically disconnect) one or more of the memory cells 202B, 202D from their corresponding via path 210B, 210D to the bitline BL. Further, as shown in FIG. 2B, one or more open paths 214 may be formed to decouple the one or more memory cells 202B, 202D from the bitline BL by forming a cut opening (e.g., etched open path, gap, or opening) between the one or more memory cells 202B, 202D and their corresponding via path 210B, 210D to the bitline BL.

In some cases, decoupling the one or more memory cells 202B, 202D from their corresponding via path 210B, 210D with the one or more open paths 204, 214 refers to single mask programming of the memory cell array 200. As such, the open paths 204, 214 may be formed with a single mask layer (or single pattern) to etch away (or remove) a portion of the metal trace 206. In some cases, this single mask layer may be referred to as an etch layer or CUT layer. For instance, the open paths 204, 214 may be formed with a CUT metal layer that is different than the one or more layers for the first and second layers M1, M2. The CUT metal layer may also be different than the one or more other layers for the memory cells 202A, 202B, 202C, 202D. Further, the CUT metal layer may also be different than the one or more others layers for the via paths 210A, 210B, 210C, 210D.

In some implementations, the via paths 210A, 210C coupling one or more of the memory cells 202A, 202C to the bitline BL may provide a first logic value (e.g., logical data value of '1'), and the open paths 204, 214 decoupling one or more of the memory cells 202B, 202D from the bitline BL may provide a second logic value (e.g., logical data value of '0') that is different than the first logic value. I.e., each of the memory cells 202A, 202C having an electrically coupled via path 210A, 210C to the bitline BL may provide the first logic value (e.g., logical '1'), and each of the memory cells 202, 202D having an electrically decoupled open path 204, 214 to the bitline BL may provide the second logic value (e.g., logical '0') that is different than the first logic value.

Thus, in some implementations, some of the memory cells 202A, 202C may be referred to as first memory cells designated for storing a first logic value (e.g., logical '1'), and some of the memory cells 202B, 202D may be referred to as second memory cells designated for storing a second logic value (e.g., logical '0') that is different than the first logic value. In this instance, some of the via paths 210A, 210C may be referred to as first via paths that couple each of the first memory cells 202A, 202C to the bitline BL, and some of the via paths 210B, 210B may be referred to as second via paths that couple each of the second memory cells 202B, 202D to the bitline BL. Thus, in this instance, the one or more open paths 204, 214 may be formed to decouple (or electrically disconnect) each of the second memory cells 202B, 202D from the bitline BL by forming a cut opening (e.g., etched void or gap) between each of the second memory cells 202B, 202D and each of the second via paths 210B, 210D.

In some implementations, as shown in FIGS. 2A-2B, each of the memory cells 202A, 202B, 202C, 202D may include at least one transistor T1, T2, T3, T4. In some cases, as further shown in FIGS. 2A-2B, each of the transistors T1, T2, T3, T4 may be implemented with a first type of transistor, such as an n-type metal-oxide-semiconductor (NMOS) transistor, which may also be referred to as an n-type MOS field-effect transistor (NMOSFET or NFET). In these cases, the voltage source bus VSB may be implemented as a ground voltage line (e.g., GND, VSS, V−, or similar ground line), and each of the memory cells 202A, 202B, 202C, 202D may be coupled to the ground voltage line (e.g., GND, VSS, V−, or similar) with another plurality of via paths 220A, 220B, 220C, 220D such that each of the memory cells 202A, 202B, 202C, 202D are coupled between the bitline BL and the ground voltage line (e.g., GND, VSS, V−, or similar).

Further, as shown in FIGS. 2A-2B, the memory array 200 may include another access path or wire, such as e.g., a wordline WL, coupled to a gate of each transistor T1, T2, T3, T4 of each memory cell 202A, 202B, 202C, 202D, respectively. As previously described herein, activating a gate of a specific memory cell 202A, 202B, 202C, 202D with the wordline WL provides for accessing a data value stored in the activated memory cell 202A, 202B, 202C, 202D, which becomes available on the bitline BL.

Figure 1:
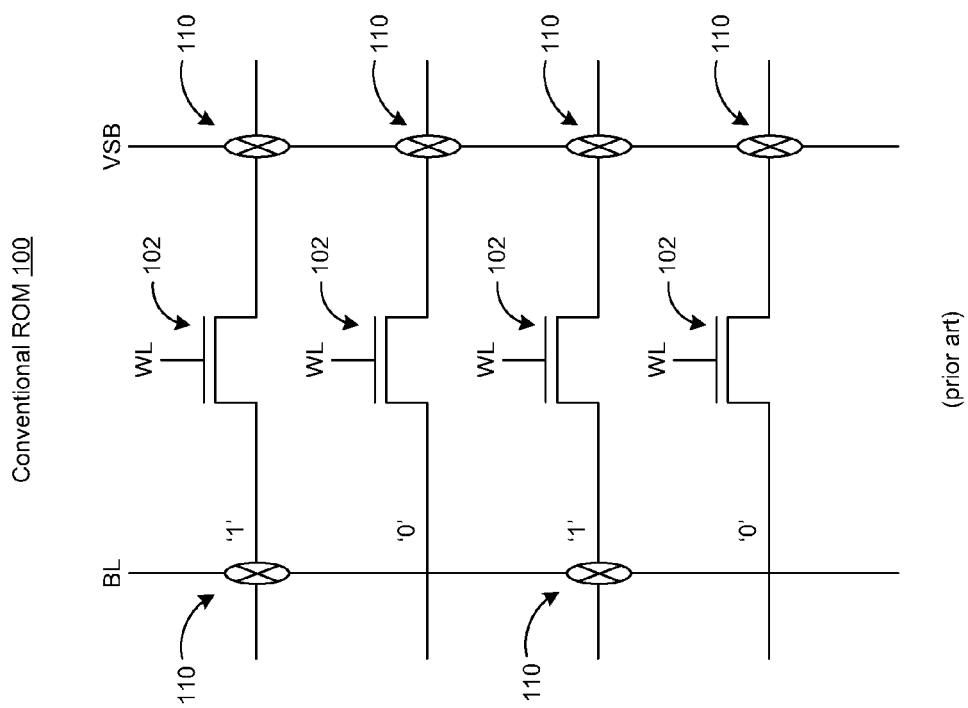
FIG. 1 illustrates conventional memory circuitry as known in the art.

In some instances, comparison between conventional VIA ROM and CUT Metal ROM may be summarized as follows. As shown in reference to FIG. 1, only the bitline BL is programmed, wherein for reading '0', no VIA is dropped, and for reading '1', a VIA is dropped to connect the bitline BL to the transistor 102. Thus, in conventional fabrication techniques, the VIAs are double or triple-patterned, which may cost two or three mask changes during fabrication. In contrast, as shown for instance in reference to FIGS. 2A-2B, both of the bitline BL and the VSB line are coupled (e.g., hard connected) to each of the memory cells 202A, 202B, 202C, 202D (i.e., transistors T1, T2, T3, T4) using VIAs 210, 220. Further, the bitline BL may be programmed with open paths 204, 214, wherein for reading a '1', the coupling (or hard connection) is left as is, and for reading a '0', the metal trace wire 206 is cut (or etched) using a CUT metal layer mask to form one or more open paths 204, 214 by forming a cut opening or gap in the metal trace wire 206. Thus, with this CUT metal fabrication technique of the present disclosure, the CUT metal layers may be dedicated to a single pre-colored metal, where a single mask may be used or changed while programming memory cells (e.g., ROM cells) during fabrication. As such, one of the advantages for the CUT metal fabrication technique of the present disclosure refers to using single mask programming of memory (e.g., ROM) during fabrication.

Figures 3A, 3B:
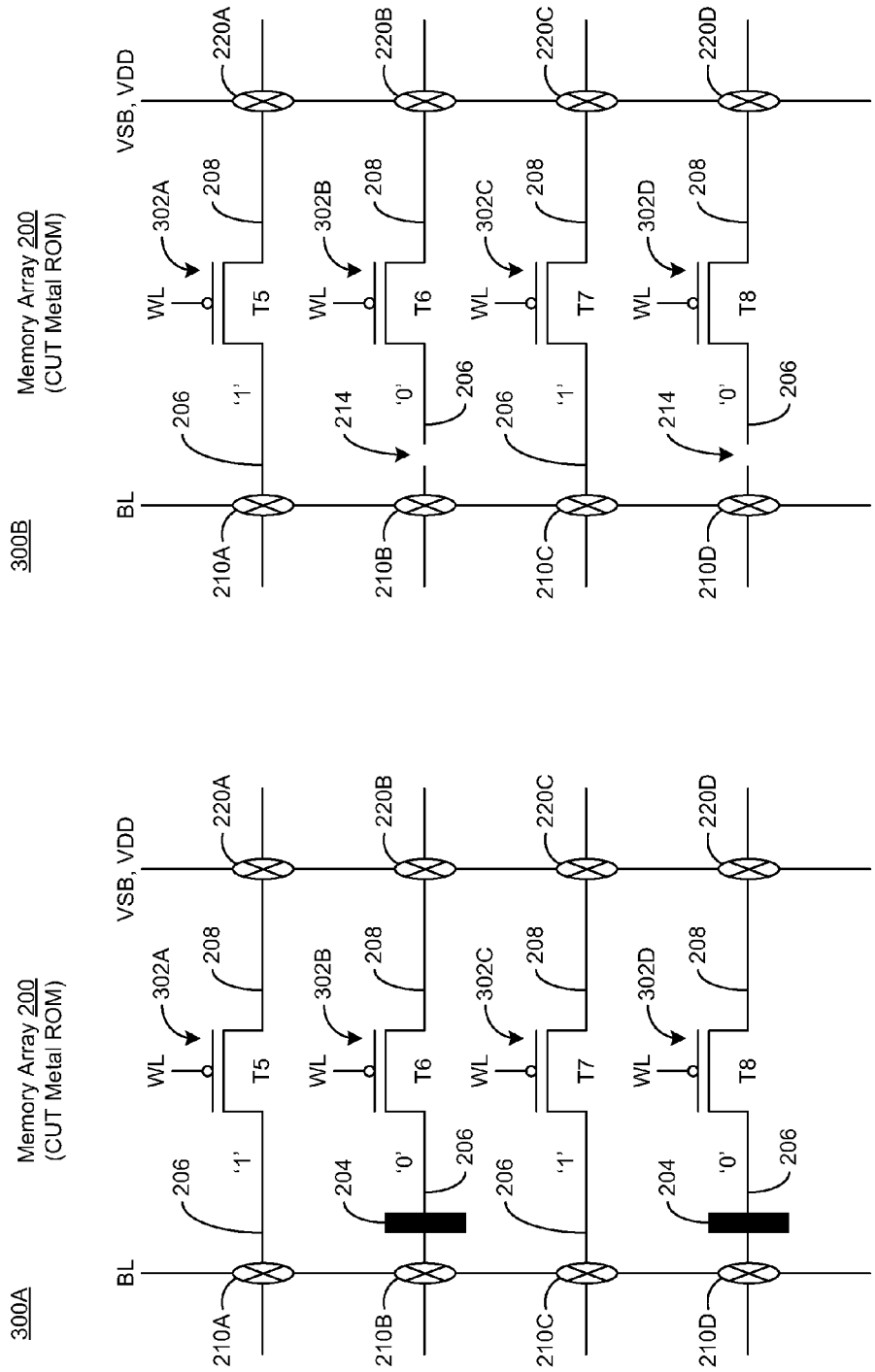
FIGS. 3A-3B illustrate diagrams of a cut metal memory array with a second type of transistor in accordance with various implementations described herein.

FIGS. 3A-3B illustrate other diagrams of the cut metal memory array 200 with a second type of memory cells 302A, 302B, 302C, 302D (e.g., implementing a second type of transistor) in accordance with various implementations described herein. In particular, FIG. 3A illustrates a diagram 300A of the array of memory cells 302A, 302B, 302C, 302D having the first open path 204 shown with the black void, and FIG. 3B illustrates another diagram 300B of the array of memory cells 302A, 302B, 302C, 302D having the second open path 314 shown with the cut opening. As shown, FIGS. 3A-3B have similar features and components as with FIGS. 2A-2B, and thus, some repeated descriptions may have been omitted for simplicity.

In some implementations, as shown in FIGS. 3A-3B, each of the memory cells 202A, 202B, 202C, 202D may include at least one transistor T5, T6, T7, T8 that is different than the transistors T1, T2, T3, T4 of FIGS. 2A-2B. For instance, as further shown in FIGS. 3A-3B, each of the transistors T5, T6, T7, T8 may be implemented with a second type of transistor, such as a p-type MOS (PMOS) transistor, which may also be referred to as a p-type MOSFET (PMOSFET or PFET). In these cases, the voltage source bus VSB may be implemented as a source voltage line (e.g., VDD, V+, or similar source line), and each of the memory cells 202A, 202B, 202C, 202D may be coupled to the source voltage line (e.g., VDD, V+, or similar) with another plurality of via paths 220A, 220B, 220C, 220D such that each of the memory cells 202A, 202B, 202C, 202D are coupled between the bitline BL and the source voltage line (e.g., VDD, V+, or similar).

In some cases, each memory cell may be implemented with read-only memory (ROM) circuitry, or some other type of non-volatile type memory. In some other cases, each memory cell may be implemented with random access memory (RAM) circuitry, or some other type of volatile type memory. For instance, each memory cell may include a multi-transistor static RAM (SRAM) cell, including various types of SRAM cells, such as, e.g., 6T CMOS SRAM and/or other types of complementary MOS (CMOS) SRAM cells, such as, e.g., 4T, 8T, 10T, or more transistors per bit. Therefore, in various cases, each memory cell may be implemented with non-volatile type memory, such as, e.g., Read-Only Memory (ROM), Dynamic RAM (DRAM), etc., or with volatile type memory (e.g., SRAM, etc.). Hence, the memory circuitry described herein is not limited to non-volatile type memory applications, such as, e.g., ROM, DRAM, etc., but may be utilized in various volatile type memory applications, such as, e.g., RAM, SRAM, etc. Accordingly, various CUT metal layer techniques that are described herein may be used in any type of circuit or integrated circuit (e.g., memory circuit) that implements vias (VIAs).

Figure 4:
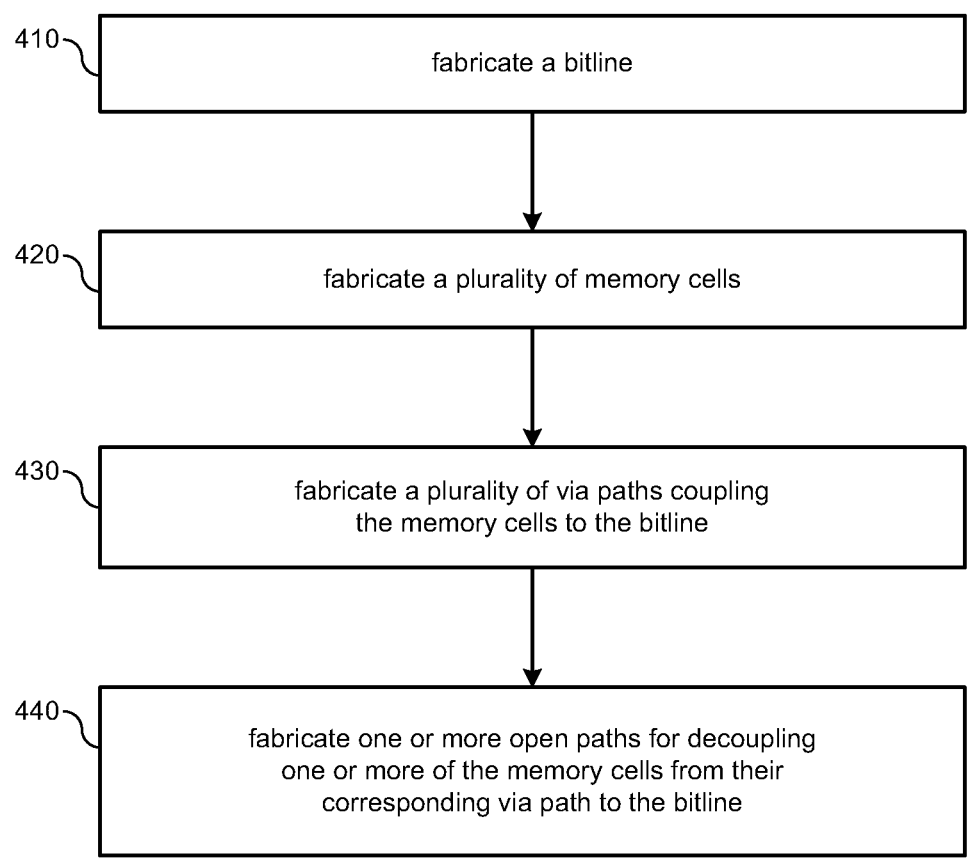
FIG. 4 illustrates a process flow of a method of manufacturing in accordance with various implementations described herein.

FIG. 4 illustrates a process flow of a method of manufacturing in accordance with various implementations described herein. It should be understood that even though method 400 may indicate a particular order of operation execution, in some cases, various certain portions of the operations may be executed in a different order, and on different systems. In some other cases, additional operations and/or steps may be added to and/or omitted from method 400. Further, method 400 may be implemented in hardware and/or software. If implemented in hardware, the method 400 may be implemented with various circuit components, such as described herein above in reference to FIGS. 2A-3B.

If implemented in software, the method 400 may be implemented as a program or software instruction process that may be configured to manufacture a memory array and memory cells using a cut metal layer as described herein. Further, if implemented in software, instructions related to implementing the method 400 may be stored in memory and/or a database. For instance, a computer or various other types of computing devices having a processor and memory may be configured to perform method 400.

In reference to FIG. 4, method 400 may refer to a method of manufacturing memory cells using a cut layer. For instance, method 400 may refer to a process flow for reducing mask cost while memory cells (e.g., ROM cells) are programmed.

In some implementations, at block 410, method 400 may fabricate a bitline. At block 420, method 400 may fabricate a plurality of memory cells. At block 430, method 400 may fabricate a plurality of via paths coupling the memory cells to the bitline. At block 440, method 400 may fabricate one or more open paths for decoupling one or more of the memory cells from their corresponding via path to the bitline. In some implementations, fabricating the plurality of memory cells may include fabricating a memory cell array having the plurality of memory cells, and fabricating the one or more open paths may refer to single mask programming of the memory cell array.

Described herein are various implementations of an integrated circuit. The integrated circuit may include a bitline. The integrated circuit may include a memory cell array having a plurality of memory cells. The integrated circuit may include a plurality of via paths coupling each of the memory cells to the bitline. The integrated circuit may include one or more open paths formed to decouple one or more memory cells from their corresponding via path to the bitline.

Described herein are various implementations of a circuit. The circuit may include a bitline. The circuit may include a memory cell array having a plurality of memory cells, including first memory cells designated for storing a first logic value and second memory cells designated for storing a second logic value that is different than the first logic value. The circuit may include a plurality of via paths coupling each of the plurality of memory cells to the bitline, including first via paths coupling each of the first memory cells to the bitline and second via paths coupling each of the second memory cells to the bitline. The circuit may include one or more open paths formed to decouple each of the second memory cells from the bitline by forming a cut opening between each of the second memory cells and each of the second via paths.

Described herein are various implementations of a method of fabricating an integrated circuit. The method may include fabricating a bitline. The method may include fabricating a plurality of memory cells. The method may include fabricating a plurality of via paths coupling the memory cells to the bitline. The method may include fabricating one or more open paths for decoupling one or more of the memory cells from their corresponding via path to the bitline.

It should be intended that the subject matter of the claims not be limited to the implementations and illustrations provided herein, but include modified forms of those implementations including portions of implementations and combinations of elements of different implementations in accordance with the claims. It should be appreciated that in the development of any such implementation, as in any engineering or design project, numerous implementation-specific decisions should be made to achieve developers' specific goals, such as compliance with system-related and business related constraints, which may vary from one implementation to another. Moreover, it should be appreciated that such a development effort may be complex and time consuming, but would nevertheless be a routine undertaking of design, fabrication, and manufacture for those of ordinary skill having benefit of this disclosure.

Reference has been made in detail to various implementations, examples of which are illustrated in the accompanying drawings and figures. In the following detailed description, numerous specific details are set forth to provide a thorough understanding of the disclosure provided herein. However, the disclosure provided herein may be practiced without these specific details. In some other instances, well-known methods, procedures, components, circuits and networks have not been described in detail so as not to unnecessarily obscure details of the embodiments.

It should also be understood that, although the terms first, second, etc. may be used herein to describe various elements, these elements should not be limited by these terms. These terms are only used to distinguish one element from another. For example, a first element could be termed a second element, and, similarly, a second element could be termed a first element. The first element and the second element are both elements, respectively, but they are not to be considered the same element.

The terminology used in the description of the disclosure provided herein is for the purpose of describing particular implementations and is not intended to limit the disclosure provided herein. As used in the description of the disclosure provided herein and appended claims, the singular forms "a," "an," and "the" are intended to include the plural forms as well, unless the context clearly indicates otherwise. The term "and/or" as used herein refers to and encompasses any and all possible combinations of one or more of the associated listed items. The terms "includes," "including," "comprises," and/or "comprising," when used in this specification, specify a presence of stated features, integers, steps, operations, elements, and/or components, but do not preclude the presence or addition of one or more other features, integers, steps, operations, elements, components and/or groups thereof.

As used herein, the term "if" may be construed to mean "when" or "upon" or "in response to determining" or "in response to detecting," depending on the context. Similarly, the phrase "if it is determined" or "if [a stated condition or event] is detected" may be construed to mean "upon determining" or "in response to determining" or "upon detecting [the stated condition or event]" or "in response to detecting [the stated condition or event]," depending on the context. The terms "up" and "down"; "upper" and "lower"; "upwardly" and "downwardly"; "below" and "above"; and other similar terms indicating relative positions above or below a given point or element may be used in connection with some implementations of various technologies described herein.

While the foregoing is directed to implementations of various techniques described herein, other and further implementations may be devised in accordance with the disclosure herein, which may be determined by the claims that follow.

Although the subject matter has been described in language specific to structural features and/or methodological acts, it is to be understood that the subject matter defined in the appended claims is not necessarily limited to the specific features or acts described above. Rather, the specific features and acts described above are disclosed as example forms of implementing the claims.

What is claimed is:

1. An integrated circuit, comprising:
   a bitline;
   a memory cell array having a plurality of memory cells;
   a plurality of via paths coupling each of the memory cells to the bitline; and
   one or more open paths formed to decouple one or more memory cells from their corresponding via path to the bitline,
   wherein the one or more open paths are formed to decouple the one or more memory cells from the bitline by forming a cut opening between the one or more memory cells and their corresponding via path to the bitline.

2. The integrated circuit of claim 1, wherein the one or more open paths formed to decouple the one or more memory cells from their corresponding via path to the bitline includes etching away or removing a portion of a metal trace to form the cut opening between the one or more memory cells and their corresponding via path to the bitline.

3. The integrated circuit of claim 1, wherein the via paths coupling the memory cells to the bitline provide a first logic value, and wherein the open paths formed to decouple the one or more memory cells from the bitline provide a second logic value that is different than the first logic value.

4. The integrated circuit of claim 1, wherein each of the memory cells having a coupled via path to the bitline provides a first logic value, and wherein each of the memory cells having a decoupled open path to the bitline provides a second logic value that is different than the first logic value.

5. The integrated circuit of claim 1, wherein the one or more via paths comprise one or more vertical interconnect access paths.

6. The integrated circuit of claim 1, further comprising a voltage source bus, wherein each of the memory cells is coupled to the voltage source bus.

7. The integrated circuit of claim 6, wherein the voltage source bus comprises a ground voltage line, and wherein each of the memory cells is coupled to the ground voltage line with another plurality of via paths such that each of the memory cells is coupled between the bitline and the ground voltage line.

8. The integrated circuit of claim 6, wherein the voltage source bus comprises a source voltage line, and wherein each of the memory cells is coupled to the source voltage line with another plurality of via paths such that each of the memory cells is coupled between the bitline and the source voltage line.

9. The integrated circuit of claim 1, wherein each of the memory cells comprises one or more n-type metal-oxide-semiconductor (NMOS) transistors.

10. The integrated circuit of claim 1, wherein each of the memory cells comprises one or more p-type metal-oxide-semiconductor (PMOS) transistors.

11. A circuit comprising:
    a bitline;
    a memory cell array having a plurality of memory cells, including first memory cells designated for storing a first logic value and second memory cells designated for storing a second logic value that is different than the first logic value;
    a plurality of via paths coupling each of the plurality of memory cells to the bitline, including first via paths coupling each of the first memory cells to the bitline and second via paths coupling each of the second memory cells to the bitline; and one or more open paths formed to decouple each of the second memory cells from the bitline by forming a cut opening between each of the second memory cells and each of the second via paths.

12. The circuit of claim 11, wherein the one or more open paths formed to decouple each of the second memory cells from the bitline includes etching away or removing a portion of a metal trace to form the cut opening.

13. The circuit of claim 11, wherein the first via paths coupling each of the first memory cells to the bitline provide the first logic value, and wherein the one or more open paths formed to decouple each of the second memory cells from the bitline provide the second logic value that is different than the first logic value.

14. The circuit of claim 11, wherein each of the first memory cells having a coupled via path to the bitline provides the first logic value, and wherein each of the second memory cells having a decoupled open path to the bitline provides the second logic value that is different than the first logic value.

15. The circuit of claim 11, further comprising a voltage source bus, wherein each of the first and second memory cells is coupled to the voltage source bus.

16. The circuit of claim 15, wherein the voltage source bus comprises a ground voltage line, and wherein each of the first and second memory cells is coupled to the ground voltage line with another plurality of via paths such that each of the first and second memory cells is coupled between the bitline and the ground voltage line, and wherein each of the first and second memory cells comprises one or more n-type metal-oxide-semiconductor (NMOS) transistors.

17. The circuit of claim 15, wherein the voltage source bus comprises a source voltage line, and wherein each of the first and second memory cells is coupled to the source voltage line with another plurality of via paths such that each of the first and second memory cells is coupled between the bitline and the source voltage line, and wherein each of the first and second memory cells comprises one or more p-type metal-oxide-semiconductor (PMOS) transistors.

18. A method comprising:
fabricating a bitline;
fabricating a plurality of memory cells;
fabricating a plurality of via paths coupling the memory cells to the bitline; and
fabricating one or more open paths for decoupling one or more of the memory cells from their corresponding via path to the bitline by forming a cut opening between one or more of the memory cells and their corresponding via path to the bitline.

19. The method of claim 18, wherein fabricating the plurality of memory cells comprises fabricating a memory cell array having the plurality of memory cells, and wherein fabricating the one or more open paths includes etching away or removing a portion of a metal trace to form the cut opening.

* * * * *